(12) United States Patent
Dempsey et al.

(10) Patent No.: US 11,431,334 B2
(45) Date of Patent: Aug. 30, 2022

(54) CLOSED LOOP SWITCH CONTROL SYSTEM AND METHOD

(71) Applicant: Analog Devices International Unlimited Company, Limerick (IE)

(72) Inventors: Dennis A. Dempsey, Newport (IE); James Thomas Sheeran, Abbeyleix (IE)

(73) Assignee: Analog Devices International Unlimited Company, Limerick (IE)

(*) Notice: Subject to any disclaimer, the term of this patent is extended or adjusted under 35 U.S.C. 154(b) by 173 days.

(21) Appl. No.: 16/841,132

(22) Filed: Apr. 6, 2020

(65) Prior Publication Data
US 2021/0313981 A1 Oct. 7, 2021

(51) Int. Cl.
*H03K 17/14* (2006.01)
*H03K 17/687* (2006.01)
*H03K 17/0412* (2006.01)

(52) U.S. Cl.
CPC ......... *H03K 17/14* (2013.01); *H03K 17/0412* (2013.01); *H03K 17/6871* (2013.01)

(58) Field of Classification Search
CPC ............................ H03K 17/0412; H03K 17/14
See application file for complete search history.

(56) References Cited

U.S. PATENT DOCUMENTS

| 5,075,677 A | 12/1991 | Meaney et al. |
| 5,726,582 A | 3/1998 | Hedberg |
| 5,744,385 A | 4/1998 | Hojabri |
| 5,764,174 A | 6/1998 | Dempsey et al. |
| 5,880,627 A | 3/1999 | Thiel, V |
| 5,880,634 A | 3/1999 | Babanezhad |
| 5,936,445 A | 8/1999 | Babanezhad et al. |
| 6,522,199 B2 | 2/2003 | Sidiropoulos et al. |
| 6,888,508 B2 | 5/2005 | Lindenmeier |
| 6,922,092 B2 | 7/2005 | Stark et al. |
| 7,119,802 B2 | 10/2006 | Suyama et al. |
| 7,915,959 B2 | 3/2011 | Shibata |

(Continued)

FOREIGN PATENT DOCUMENTS

| CH | 357092 | 9/1961 |
| CN | 1081407 | 3/2002 |

(Continued)

OTHER PUBLICATIONS

"Stability Analysis of Voltage-Feedback Op Amps Including Compensation Techniques", Texas Instruments Application Report, (Mar. 2001), 30 pgs.

(Continued)

*Primary Examiner* — Patrick O Neill
(74) *Attorney, Agent, or Firm* — Schwegman Lundberg & Woessner, P.A.

(57) ABSTRACT

A closed loop switch control system and a corresponding method is provided for controlling an impedance of a switch. The switch, which usually comprises a transistor switch, may be part of an external circuit. The system comprises the switch and a control unit coupled to the switch. The control unit is configured to regulate an impedance of the switch to a reference impedance while also enabling a fast switch (Continued)

response time. This is achieved by configuring the control unit to have a frequency response comprising a plurality of dominant poles and at least one zero.

20 Claims, 12 Drawing Sheets

(56) References Cited

U.S. PATENT DOCUMENTS

| | | | |
|---|---|---|---|
| 7,952,419 | B1 | 5/2011 | Birk |
| 8,102,206 | B2 | 1/2012 | Shibata |
| 8,350,626 | B2 | 1/2013 | Shibata |
| 8,368,453 | B2 | 2/2013 | Company Bosch et al. |
| 8,536,939 | B2 | 9/2013 | Shibata et al. |
| 8,537,043 | B1 | 9/2013 | Downey et al. |
| 8,659,349 | B1 | 2/2014 | Lyden et al. |
| 8,710,541 | B2 | 4/2014 | Aherne et al. |
| 8,829,975 | B2 | 9/2014 | Aherne |
| 9,397,570 | B2 | 7/2016 | Wrathall |
| 9,583,241 | B1 | 2/2017 | Dempsey |
| 9,671,437 | B2 * | 6/2017 | Akahane .............. H02H 3/08 |
| 2007/0252648 | A1 | 11/2007 | Ravezzi et al. |
| 2008/0297244 | A1 | 12/2008 | Poulsen et al. |
| 2010/0134181 | A1 | 6/2010 | Kinsella |
| 2011/0121802 | A1 | 5/2011 | Zhu |
| 2011/0234301 | A1 | 9/2011 | Gruber |
| 2011/0234312 | A1 | 9/2011 | Lachhwani et al. |
| 2014/0232580 | A1 | 8/2014 | Gutta et al. |
| 2016/0268977 | A1 | 9/2016 | Ito et al. |
| 2017/0359077 | A1 | 12/2017 | Dempsey et al. |
| 2018/0321187 | A1 | 11/2018 | Gu et al. |

FOREIGN PATENT DOCUMENTS

| | | |
|---|---|---|
| CN | 101917171 | 12/2010 |
| CN | 106788356 | 5/2017 |
| EP | 1876710 | 6/2011 |
| JP | 2004336699 | 11/2004 |
| TW | M359871 | 6/2009 |
| WO | 2009044504 | 4/2009 |

OTHER PUBLICATIONS

Bencherif, H., "Temperature and SiO2 4H-SiC interface trap effects on the electrical characteristics of low breakdown voltage MOSFETs", Applied Phyiscs A, 125:294, (2019), 10 pgs.

Dixon, Lloyd, "Control Loop Design", Texas Instruments, (2001), 12 pgs.

Gomez, Roderick, "Design of Two-Stage Operational Amplifier using Indirect Feedback Frequency Compensation", Undergraduate Honors Thesis, U. of Arkansas, (2019), 26 pgs.

Loikkanen, Mikko, "Design and Compensation of High Performance Class AB Amplifiers", Dissertation, University of Oulu, FI, (May 2010), 80 pgs.

Mancini, Ron, "Op Amps for Everyone", Texas Instruments Design Reference, Advanced Analog Products SLOD006B, (Aug. 2002), 464 pgs.

Thomsen, Axel, "A Five Stage Chopper Stabilized Instrumentation Amplifier Using Feedforward Compensation", IEEE Symposium on VLSI Circuits Digest of Technical Papers (Cat. No. 98CH36215), (1998), 220-223.

Widlar, Robert J, "Feedforward Compensation Speeds Op Amp", National Semiconductor Linear Brief 2, (Mar. 1969), 1 pg.

You, Fan, "A Multistage Amplifier Topology with Nested Gm-C Compensation for Low-Voltage Application", IEEE International Solid-State Circuits Conference, Digest of Technical Papers, (1997), 1 pg.

Zhang, Henry J, "Modeling and Loop Compensation Design of Switching Mode Power Supplies", Linear Technology Application Note 149, (Jan. 2015), 22 pgs.

"International Application Serial No. PCT/EP2021/057895, International Search Report dated Jul. 12, 2021", 5 pgs.

"International Application Serial No. PCT/EP2021/057895, Written Opinion dated Jul. 12, 2021", 7 pgs.

"Taiwanese Application Serial No. 110112102, First Office Action dated Sep. 15, 2021", 6 pgs.

Reljin, Branimir D, "Properties of SAB filters with the two-pole single-zero compensated operational amplifier", Circuit Theory and Applications: Letters to the Editor, vol. 10, (1982), 277-285.

* cited by examiner

CLOSED LOOP SWITCH CONTROL SYSTEM AND METHOD

FIELD OF DISCLOSURE

The present disclosure relates to a closed loop switch control system. In particular, it relates to a closed loop switch control system configured to control the impedance of a transistor switch.

BACKGROUND

A transistor switch is a common element in several analog circuits. A transistor switch can be for example, a bipolar junction transistor (BJT) device or any variant of a field effect transistor (FET). For example, FETs include metal oxide semiconductor FET (MOSFET) devices, junction FET (JFET) devices, double-diffused metal oxide semiconductor (DMOS) devices, a fin FET (finFET) devices or Gate All Around FET devices (GAA FETs). The performance of these devices may vary, for example, due to variations in the process used for fabrication of the devices and can include local variations within a single die, lot-to-lot variations or variations across a wafer on which the devices are fabricated.

A key performance parameter of a transistor switch is its impedance. The impedance of a switch can change in value during operation, due to factors such as supply voltage to the switch, the input bias voltage, the load at the output of the switch or due to ambient conditions, for example the operating temperature of the circuit comprising the switch. MOSFET devices are commonly used as switches in power applications. In a MOSFET device, the on-state impedance (or on-state resistance, in DC conditions), is the impedance measured between the drain and the source of the MOSFET when the MOSFET is on.

A key requirement for switches when used in some applications is that the switch must have a low on-impedance. Switches are often rated, by the manufacturer, with an on-impedance at a given temperature and this value of on-impedance helps designers to select switches for different applications. The rated on-impedance value of the switch is usually calibrated out for the given temperature when measurements are made using circuits implementing the switch.

A problem with this approach is that the rated on-impedance value may not be entirely representative of the actual impedance value for a given switch which may vary between switches as a result of variations in the manufacturing process, for example, due to lot-lot variations, local variations in a single die or variations across a wafer on which the switch devices are fabricated. There may also be a drift in the actual impedance value as a result of variations during operation of the system implementing the switch.

U.S. Pat. No. 8,710,541, which is hereby incorporated by reference, is directed to a bidirectional switch architecture configured to regulate the on-impedance of the bidirectional switch such that the on-impedance is substantially constant across input signal range, supply voltage and load current. U.S. Pat. No. 7,952,419, which is hereby incorporated by reference, is directed to a bootstrapped switch circuit which is configured to regulate the on-impedance due to a change in the gate-to-source voltage of a switch transistor.

However, there is still a need for a switch drive circuit which can efficiently regulate the impedance of a switch across different operating conditions and which can be robust to any variations in the impedance of the switch due to variations in the manufacturing process for fabricating the switch.

SUMMARY OF DISCLOSURE

A closed loop switch control system is provided for controlling an impedance of a switch. The switch, which usually comprises a transistor switch, may be part of an external circuit. The external circuit can comprise, for example, a data converter circuit or a switchable power supply circuit. The system comprises the switch and a control unit coupled to the switch. The control unit is configured to regulate an impedance of the switch to a reference impedance while also enabling a fast switch response time. This is achieved by configuring the control unit to have a frequency response comprising a plurality of dominant poles and at least one zero.

In particular, the control unit comprises at least one opamp coupling the control unit to the switch. The control unit also comprises a reference unit, configured to have a reference impedance. This reference unit can be, for example, a precision resistor which has an on-impedance with a lower tolerance or variance with operating temperature (as defined by, for example, the temperature coefficient) when compared to the transistor switch. The control unit controls the switch to regulate the corresponding on-impedance to the impedance of the reference unit. In use, the opamp of the control unit is configured to have a frequency response which has at least two dominant poles and at least one zero. The inventors have realised that the use of the above switch control system enables the control in drift of the switch across different operating temperatures while also providing a fast switch response time.

According to a first aspect of this disclosure, there is provided a closed loop switch control system comprising: a switch; a control unit coupled to the switch, the control unit being configured to generate a control signal for regulating an impedance of the switch to a reference impedance, the control unit configured to have, in use, a frequency response comprising a plurality of dominant poles and at least one zero.

According to a second aspect of this disclosure, there is provided a control unit for regulating an impedance of a switch to a reference impedance, the control unit comprising:

a first differential opamp; a replica switch configured to be substantially identical in use to the switch; and a reference unit, configured to have, in use, a reference impedance, wherein the first differential opamp is configured to generate a control signal for regulating the impedance of the switch based on a comparison between a first signal indicative of the impedance of the switch and a second signal indicative of the reference impedance, and wherein the control unit is configured to have a frequency response comprising a plurality of dominant poles and at least one zero.

According to a third aspect of this disclosure, there is provided a method for controlling an impedance of a switch, the method comprising: obtaining, by a control unit, a first signal from the switch, the first signal being indicative of the impedance of the switch; obtaining, by the control unit, a second signal from a reference load, the second signal being indicative of the impedance of the reference load; generating, using the control unit, a control signal for regulating the impedance of the switch to the impedance of the reference load based on a difference between the first signal and the second signal, wherein the control unit is configured to have, in use, a frequency response comprising a plurality of dominant poles and at least one zero.

Further features of the disclosure are defined in the appended claims.

BRIEF DESCRIPTION OF THE DRAWINGS

The teachings of this disclosure will be discussed, by way of non-limiting examples, with reference to the accompanying drawings, in which.

DETAILED DESCRIPTION

The present disclosure relates to a closed loop switch control system for regulating the impedance of a switch over different operating conditions, in particular different operating temperatures, where the switch control system is configured to enable a fast switch response time. As discussed above, the rated on-impedance value of a given switch may vary due to variations in the fabrication process of the switch: for example, lot-to-lot variations, local variations in a single die or variations across a wafer on which devices for use as switches have been fabricated. Secondly, the operation of a system implementing the switch may also vary for example as a result of the operating temperature (depending on the power dissipated in use), variations in package stress, variations in package humidity, aging, solder-reflow or even as a result of temperature cycling induced effects.

The present disclosure addresses the above problem of variance in on-impedance of a switch during its operation. In particular, the system of the present disclosure enables regulation of the impedance of the switch by providing a control unit which is configured to regulate said switch impedance to an impedance of a reference unit, typically a precision resistor. The control unit advantageously is also configured to enable a fast switch response time. This is achieved by configuring the control unit to have a frequency response with a plurality of dominant poles and at least one zero. The control unit configured in this way also provides a robust system for regulating the impedance of the switch over different operating conditions, in particular, different operating temperatures.

Figure 1:
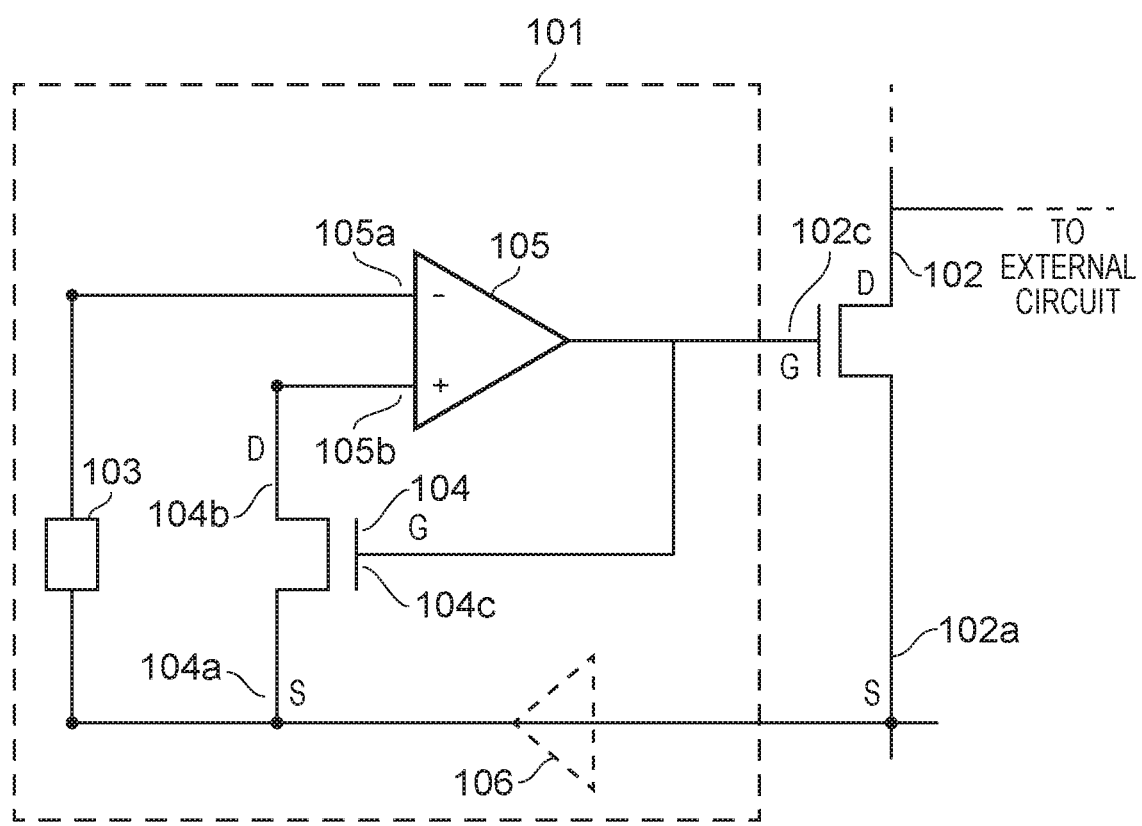
FIG. 1 shows an example representation of a switch control system, in accordance with an aspect of the present disclosure.

FIG. 1 is an embodiment of a switch control system 100, in accordance with an aspect of the present disclosure. The switch control system 100 comprises a control unit 101 coupled to a switch 102. The switch 102 can be part of an external circuit. In this embodiment, the switch 102 is a MOSFET device, although it will be appreciated that the switch control system 100 can be used to control any type of switch, for example, a BJT device or any variant of a FET for example, a JFET, a DMOS device, a finFET device or a Gate All Around FET device (GAA FET).

The control unit 101 comprises a reference unit 103. The reference unit or reference load 103 is configured to have, in use, a reference impedance. The control unit 101 further comprises a switch replica 105. The switch replica 104 is substantially identical in its performance, during use, to the switch 102.

The control unit 101 is configured to regulate, in use, the impedance of the switch 102 such that the impedance of the switch 102 tracks the impedance of the reference load 103. In the embodiment of FIG. 1, where the switch 101 is a MOSFET device, the impedance of the switch 101 is a function of the gate-to-source voltage ($V_{GS}$) of the MOSFET device.

Given that the impedance of the switch 102 is a function of $V_{GS}$, the control unit 101 is configured to control $V_{GS}$ of the switch 102 such that the impedance of the switch 102 tracks the impedance of the reference load 103. In order to achieve this, in the embodiment of FIG. 1, the control unit 101 further comprises a differential opamp 105. As seen in FIG. 1, a closed looped control system is formed comprising the differential opamp 105, the replica switch 104, the reference load 103 and the switch 102. In use, the differential opamp 105 is configured to output a control signal to the switch 102 to regulate the switch impedance, with the reference load 103 and replica switch 104 in a feedback path of the closed loop control system 100.

In FIG. 1, the reference load 103 is coupled between the source (S) terminal 102a of the switch 102 and an inverting input 105a of the opamp 105. The replica switch 104 is coupled between the source terminal 102a of the switch 102 and a non-inverting input 105b of the opamp 105, such that the drain 104b of the replica switch 104 is coupled to the non-inverting input 105b of the opamp 105 and the source 104a of the replica switch 104 is coupled to the source terminal 102a of the switch 102. The output of the opamp 105 is coupled to the gate 104c of the replica switch 104 as well as the gate 102c of the switch 102.

In use, the impedance of the switch 102 and hence the replica switch 104 may vary due to factors such as supply voltage to the switch 102, the input bias voltage, the load at the output of the switch 102 or due to ambient conditions, for example the operating temperature of the circuit comprising the switch 102. The reference load 103 is chosen such that its impedance is more stable and more robust to common mode signal variations when compared to the impedance of the switch 102. For example, in a practical implementation, the reference load 103 can be a precision resistor. The resistance of the precision resistor can be chosen to match a target impedance for the switch 102 depending on the external circuit requirements. In some other embodiments, the reference load 103 can comprise a series and/or parallel combinations of impedance elements. In some embodiments, the reference impedance may be configurable, for example, using a digital rheostat implementation. In some embodiments, active circuitry, for example, a switched current source or a sink coupled to the impedance, may also be implemented to enable configuration of the impedance of the reference load. In practical implementations, the reference load can be integrated on-chip or off-chip.

A difference between the input signals at the respective terminals (105a, 105b) of the opamp 105 is indicative of the difference in impedance between the reference load 103 and the replica switch 104. Based on its differential input, the opamp 105 outputs a control signal to regulate the impedance of the replica switch 104 and hence also the impedance of the switch 102 such that the impedance of the switch 102 tracks the impedance of the reference load 104.

The control unit 101 in FIG. 1 can optionally comprise an operational transconductance amplifier (OTA) or a voltage buffer 106. The voltage buffer 106 is configured to generate a copy of a signal received from the switch 102. In practical implementations, the copy of the signal generated by the voltage buffer 106 has a low offset. This offset can be reduced, for example, with chopping or trimming circuits. The voltage buffer 106 minimises disruption to the external circuit comprising the switch 102, when receiving feedback from the switch 102, during the operation of the control unit 101.

Figure 2:
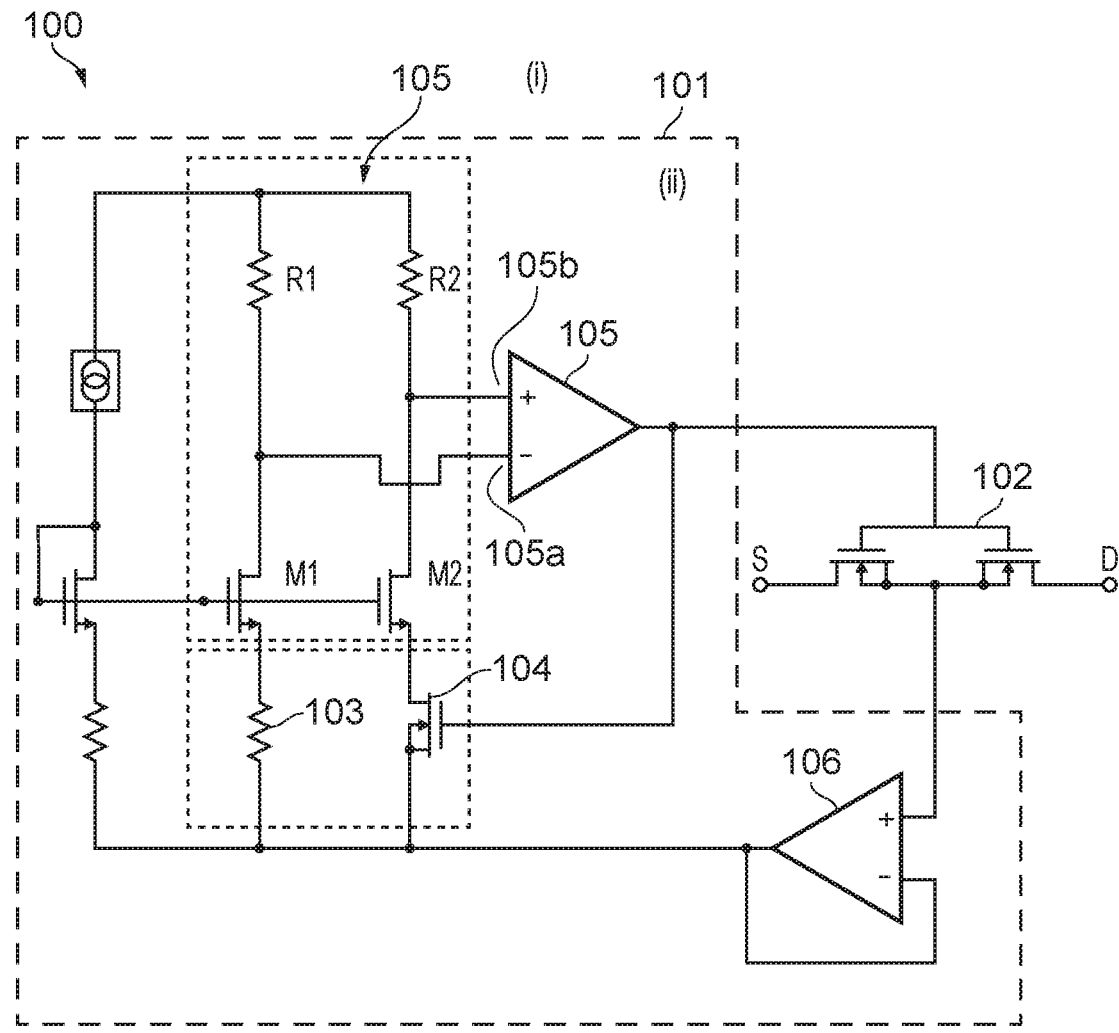
FIG. 2 shows a more detailed schematic representation of the switch control system in FIG. 1.

FIG. 2 shows a switch control system 100 which corresponds in its operation to the switch control system 100 of FIG. 1. The switch control system 100 of FIG. 2 is a more detailed version of the corresponding system 100 in FIG. 1.

In FIG. 2, the reference load 103 is shown as a precision resistor. The opamp 105 comprises two stages: a first stage 105(i) which is the input stage or preamp stage of the opamp 105 and a second stage 105(ii) which is the main gain stage of the opamp 105. FIG. 2 provides an example implementation where the preamp stage 105(i) comprises the transistors M1, M2 and resistors R1, R2. The resistor R1, transistor M1 of the opamp input stage 105(i) and the precision resistor 103, are configured to provide a signal to the non-inverting input 105a of the opamp gain stage 105b. The resistor R2, transistor M1 of the opamp input stage 105(i) and switch replica 104, are configured to provide a signal to the inverting input 105b of the opamp gain stage 105(ii).

The principle of operation of the system 100 in FIG. 2 is the same as for the system 100 in FIG. 1. That is, in response to a variation in impedance of the switch 102 or equivalently the replica switch 104—for example, due to a change in temperature of the switch 102 (and hence the replica switch 104)—the control unit 101, as already explained with respect to FIG. 1, is configured to set the impedance of the switch 102 to that of the precision resistor 103.

In practical implementations, the precision resistor 103 can have a specified temperature coefficient of resistance (TCR) which defines the maximum change in resistance of the precision resistor 103 with a change in temperature. The change in resistance of the precision resistor 103 with a change in temperature as defined by the TCR should be lower than the change in resistance (or the impedance) of the switch 102 with a change in temperature in order to ensure improved stability in the impedance of the switch 102 regulated by the control unit 101, in this case with respect to a change in temperature.

Figure 3A:
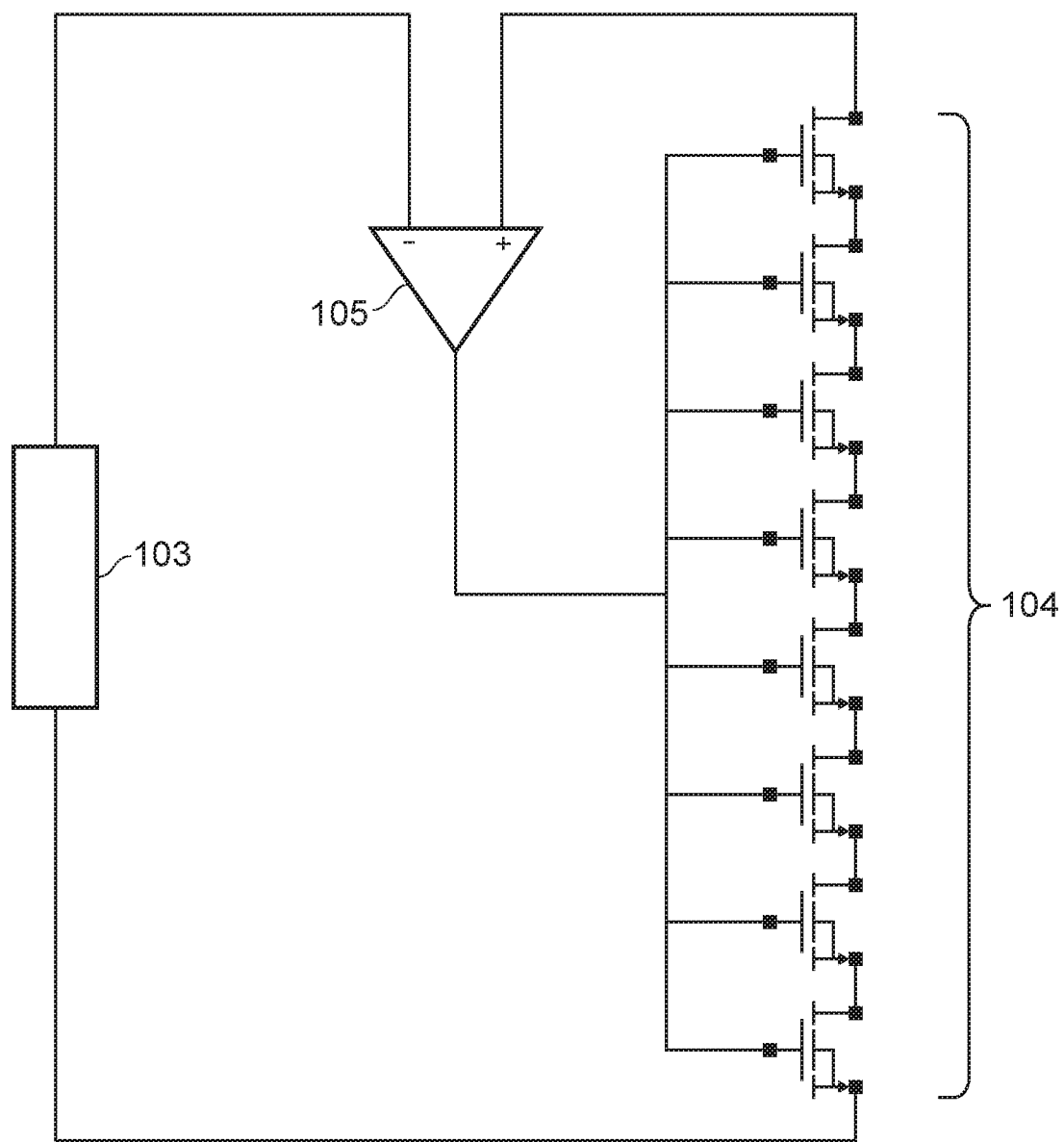
FIG. 3A shows an example schematic representation of the replica switch of FIG. 1.
Figure 3B:
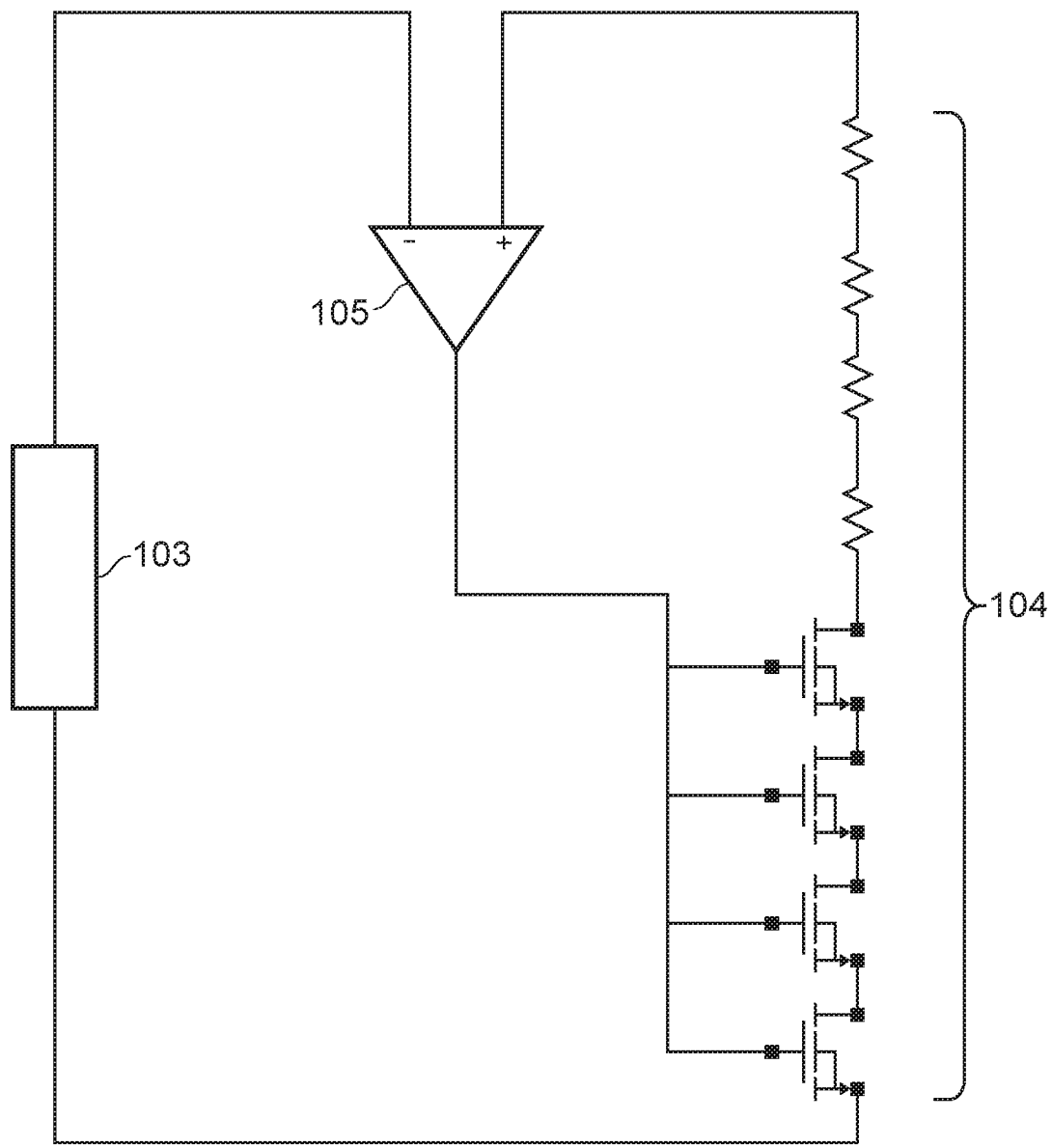
FIG. 3B shows another example schematic representation of the replica switch of FIG. 1.

In one embodiment, the replica switch 104 can be a scaled-down version of the main switch 102 to save on chip area. However when the replica switch 104 is incorporated as a scaled-down version of the switch 102, in the switch control system 100 of FIG. 1 or 2, the voltage drop across the replica switch 104 will be quite low. In order to improve the intensity of the signal generated by the replica switch 104 (for example, if the differential opamp 105 has high input sensitivity), the replica switch 104 can be implemented using a stacked configuration of transistors, for example, stacked MOS devices in series as shown in FIG. 3A. This configuration improves the intensity of the signal transmitted from the switch replica 104 to the differential opamp 105 and reduces the effect of mismatch between the switch replica 104 and the switch 102. In another embodiment, as shown in FIG. 3B, the switch replica 104 can comprise stacked transistors as well resistors in series. This configuration provides the advantages of the circuit in FIG. 3A. However, in the circuit of FIG. 3A, the source voltages of each of the MOS devices in the stack is different, which may potentially result in an error in the drain-to-source voltage ($V_{DS}$) when the signal is transmitted from the switch replica 104 to the opamp 105. The circuit in FIG. 3B reduces the $V_{DS}$ error of the circuit in FIG. 3A, by replacing some of the MOS devices in the stack with resistors.

Figure 4:
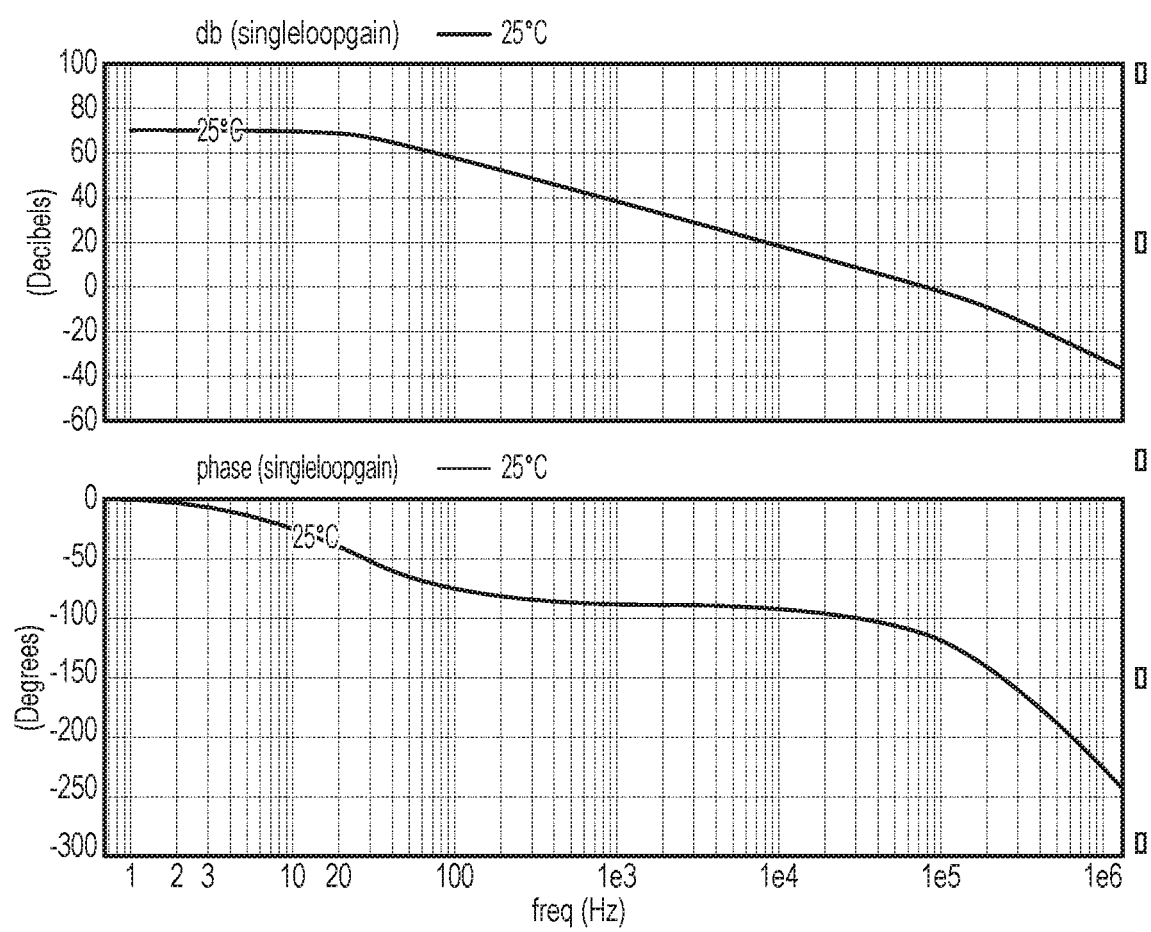
FIG. 4 shows a Bode plot of the frequency response of a single-pole opamp in a system of FIG. 1 at an operating temperature of 25° C.

FIG. 4 shows a Bode plot of the simulated frequency response of a single-pole opamp when implemented in the system 100 of FIG. 1 or FIG. 2, at an operating temperature of 25° C. The single-pole opamp could be for example, the opamp 105 in FIG. 1 or 105b in FIG. 2.

A single-pole opamp has a single dominant pole in its frequency response. In the frequency response of FIG. 4, the dominant pole frequency also defines the corner frequency ($f_c$)—that is, the frequency at which the gain of the opamp first starts to attenuate. The corner frequency corresponds to the gain value which is 3 dB below the maximum DC or low frequency gain. In FIG. 4, the corner frequency occurs approximately at 20 Hz.

There are three bandwidth regions of interest in FIG. 4. The first, low bandwidth region comprises frequencies below the corner frequency—in FIG. 4 this region corresponds to the frequencies below the corner frequency of 20 Hz. The second bandwidth region comprises frequencies above the corner frequency. For a single-pole opamp, gain rolls off for frequencies higher than the corner frequency with the product of the gain and frequency being constant. This roll-off or attenuation post the corner frequency occurs typically, at a rate of −20 dB/decade. In practical implementations, the second bandwidth or mid-band region corresponds to a system's bandwidth requirement as defined by the application of the system. That is, based on the application, a given opamp has a gain and bandwidth requirement to achieve, for example, a target speed or target bandwidth. For example, in FIG. 4, the mid-band region comprises the frequencies between 1 kHz to 10 kHz. The third high bandwidth region comprises frequencies which are significantly higher than the mid-band frequency range and the upper limit of this region is defined by the crossover frequency ($f_{co}$). In FIG. 4, the crossover frequency occurs approximately at 77 kHz. The crossover frequency is the frequency at which the gain of the opamp is equal to 0 dB or unity gain and hence this frequency is also referred to as the unity gain frequency. The crossover frequency also defines the upper limit of the entire range of frequencies in which the opamp can produce gain or the unity gain bandwidth (UGBW). For practical implementations, the usable bandwidth of the amplifier to meet target application requirements is typically less than the amplifier bandwidth, that is, the range of frequencies until the crossover frequency.

In practical implementations, a single-pole opamp may have additional poles, for example, parasitic poles at higher frequencies than the corner frequency. In this case, the conventional single-pole opamp usually comprises an internal compensation circuit to compensate for these additional poles other than the dominant pole so that its frequency response comprises a single dominant pole, as defined above.

The inventors have realised that when a single-pole opamp is implemented in a system according to FIG. 1 or FIG. 2, the bandwidth and the gain in the mid-band frequency range, which typically comprises frequencies which define the target bandwidth specification for a given application, is undesirably low. Using FIG. 4 as an example, the inventors have realised that the gain in the desired 1 kHz-10 kHz frequency range is very low. That is, the gain decreases at 20 dB/decade for frequencies higher than the corner frequency at 20 Hz. For example, the DC gain for frequencies less than 20 Hz is approximately 70 dB, the gain at 1 kHz is approximately 40 dB and the gain at 10 kHz is approximately 20 dB. It is desirable to provide an amplifier design which improves the gain in the mid-band region, for example, between 1 kHz-10 kHz range in FIG. 4.

Figure 5:
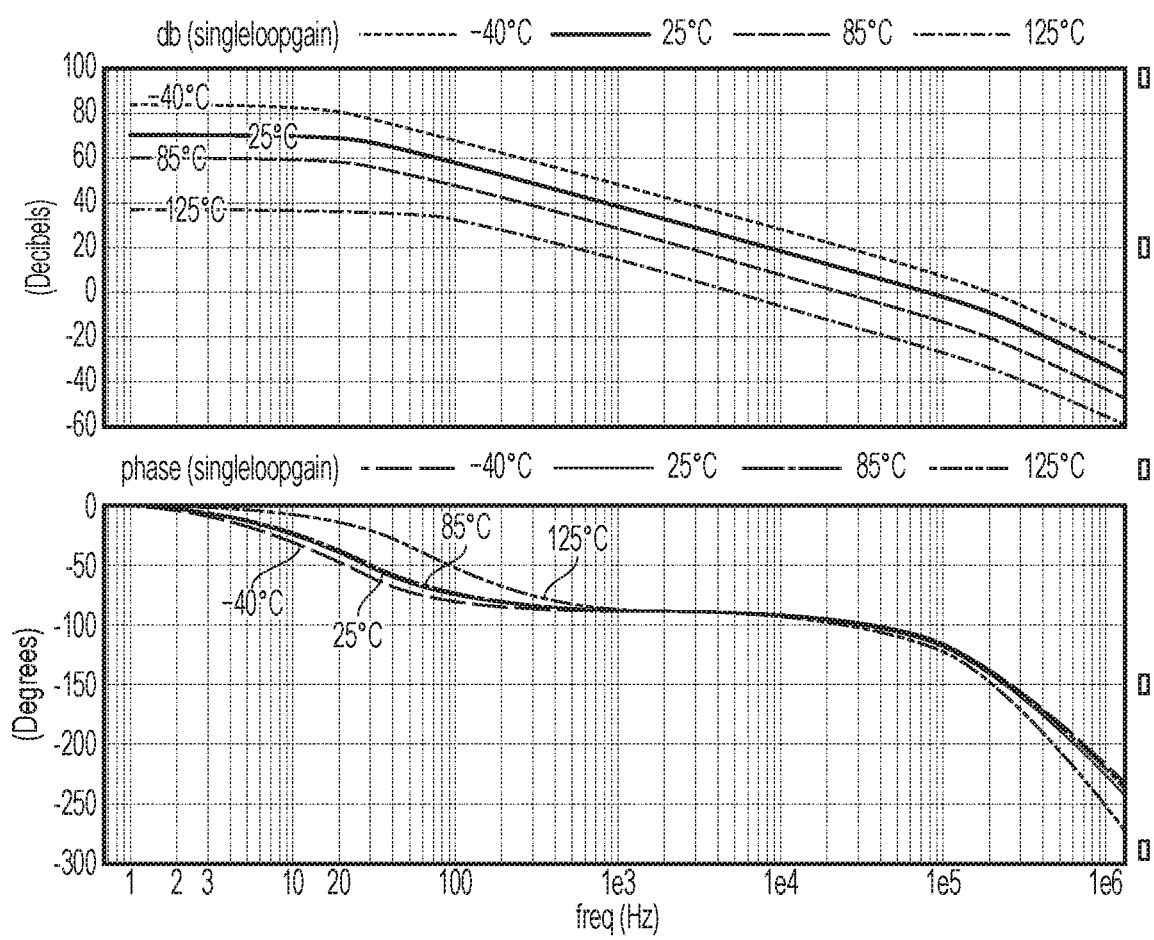
FIG. 5 shows Bode plot of a single-pole differential opamp in a system of FIG. 1, for various operating temperatures.

The inventors have also found that the frequency response of a single-pole opamp, in a system of FIG. 1 or FIG. 2, is dependent on the operating conditions, for example, the temperature of the system. FIG. 5 shows simulated frequency responses of a single-pole opamp for four different operating temperatures: −40° C., 25° C., 85° C. and 125° C. As shown in FIG. 5, the single loop gain and the crossover frequency (and hence the bandwidth) decrease with an increase in operating temperature of the system. As seen in FIG. 5, when the operating temperature of the system is −40° C., the control loop DC gain is 83 dB and the cross-over frequency is 200 kHz. When the operating temperature of the system is increased to 25° C., the DC gain decreases to 70 dB and the cross-over frequency decreases to 5 kHz. The DC gain and crossover frequency decrease further to 59 dB and 24 kHz, respectively, when the temperature is increased to 85° C. When the temperature is increased to 125° C., the DC gain and crossover frequency decrease to 36 dB and 5 kHz, respectively.

Furthermore, FIG. 5 also shows the change in phase margin of the corresponding loop transfer function varies with the operating temperature of the system. The phase margin, occurring at the crossover frequency, is a measure of the stability of the system where a positive phase margin enables a stable system. As seen in FIG. 5, for a system with a single-pole opamp in its control unit, the phase margin of the corresponding loop transfer function, increases with an increase in temperature from −40° C. to 125° C. It is noted that this temperature range is an exemplary temperature range beyond the typical 0° C. to 70° C. temperature range of relevance for practical applications. For example, at an operating temperature of −40° C., the phase margin has a value of 44° and when the temperature is increased to 125° C., the phase margin approximately doubles to 90°. An increase in the phase margin value is indicative of reducing bandwidth of a system. Therefore, in FIG. 5, an increase in phase margin with operating temperature also indicates a reduction in bandwidth with operating temperature.

Based on the above observations, the inventors have realised that a single-pole opamp, when implemented in a system of FIG. 1 or FIG. 2 has several drawbacks. Firstly, for a given operating temperature of the system, the simulated frequency response of the single-pole opamp indicates that the gain at the frequencies of interest for practical applications, for example, in the mid-band frequency range, which typically comprises frequencies which define the target bandwidth specification for a given application, is undesirably low. Secondly, the resultant usable bandwidth is also undesirably low. Thirdly, the single-loop gain, phase margin and bandwidth vary with operating temperature and this is undesirable for a robust switch control system.

Given the above-mentioned drawbacks, the inventors have recognised the need for a robust switch control system, where the frequency response of an opamp in the control unit of the system has an improved gain in the mid-band frequency range, an improved bandwidth and a reduced dependence on the operating temperature. An improved gain and a reduced dependence on the operating temperature will advantageously increase the precision of control by the switch control system. An improved, wider bandwidth will advantageously result in a higher speed of operation of the switch control system.

Figure 6A:
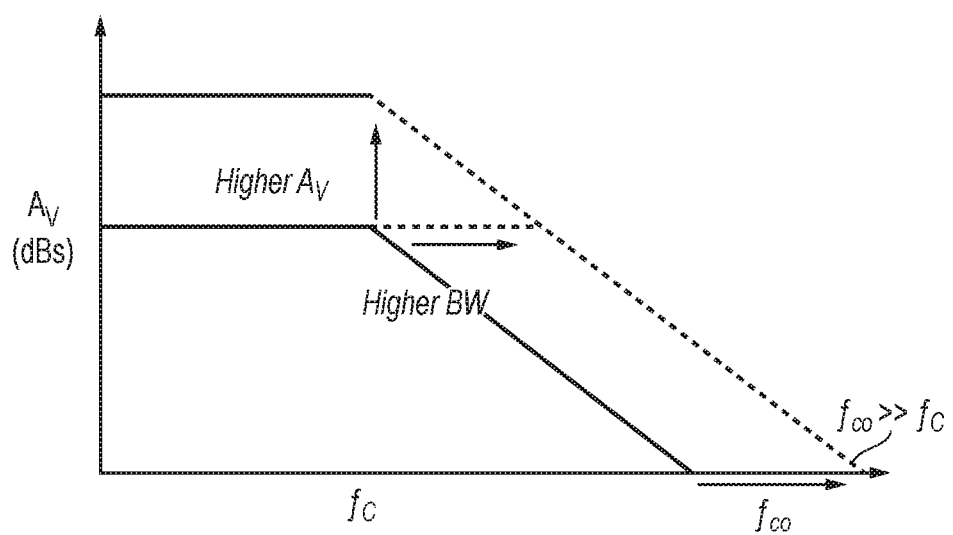
FIG. 6A shows one solution for increasing gain and/or bandwidth using a single-pole opamp.

FIG. 6A is graph which shows an illustrative example of solutions to improve the bandwidth and the gain for a single-pole opamp. FIG. 6A illustrates that one possible solution can comprise increasing the corner frequency ($f_c$) where as another possible solution can comprise increasing the gain (Av) at all frequencies, including the DC gain for frequencies below the corner frequency. However, both the solutions, as shown in FIG. 6A, require an increase in the crossover frequency ($f_{co}$) such that $f_{co} \gg f_c$. A key drawback associated with these solutions is that an increase in crossover frequency is indicative of increase in the power consumed by the single-pole opamp. The inventors have recognised that it would be desirable instead to achieve said improvement in bandwidth and in gain without having to significantly increase the crossover frequency.

Figure 6B:
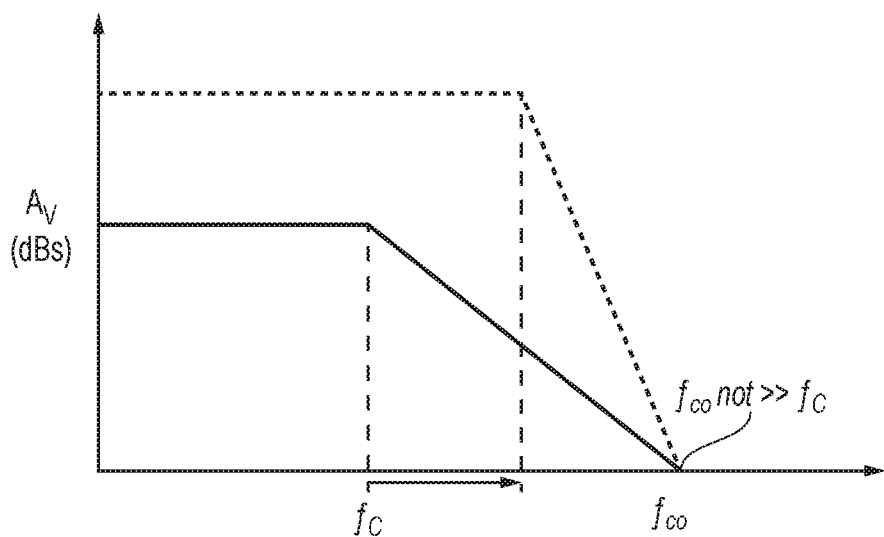
FIG. 6B shows an ideal solution for increasing gain and bandwidth according to an objective of the present disclosure.

The objective of the present invention is illustrated in the form of an ideal frequency response (dashed line) in FIG. 6B. FIG. 6B illustrates an ideal desired frequency response where an increased gain is achieved and the mid-band frequency range, and an improved bandwidth is achieved without increasing the crossover frequency ($f_{co}$). In practical implementations, the crossover frequency will still need to be increased—however, the inventors have recognised that it is desirable to minimise this increase in crossover frequency while still providing improved gain in the mid-band frequency range an improved bandwidth.

That is, the inventors have recognised the need for a power saving, efficient switch control system which still provides an improved gain in the mid-band frequencies, an improved bandwidth and reduced variability with operating conditions of the system. The inventors have realised that this objective can be achieved when one or more of the opamps in the control unit 101 is configured to have more than one pole and at least one zero, preferably two poles and one zero, in its frequency response.

Figure 7:
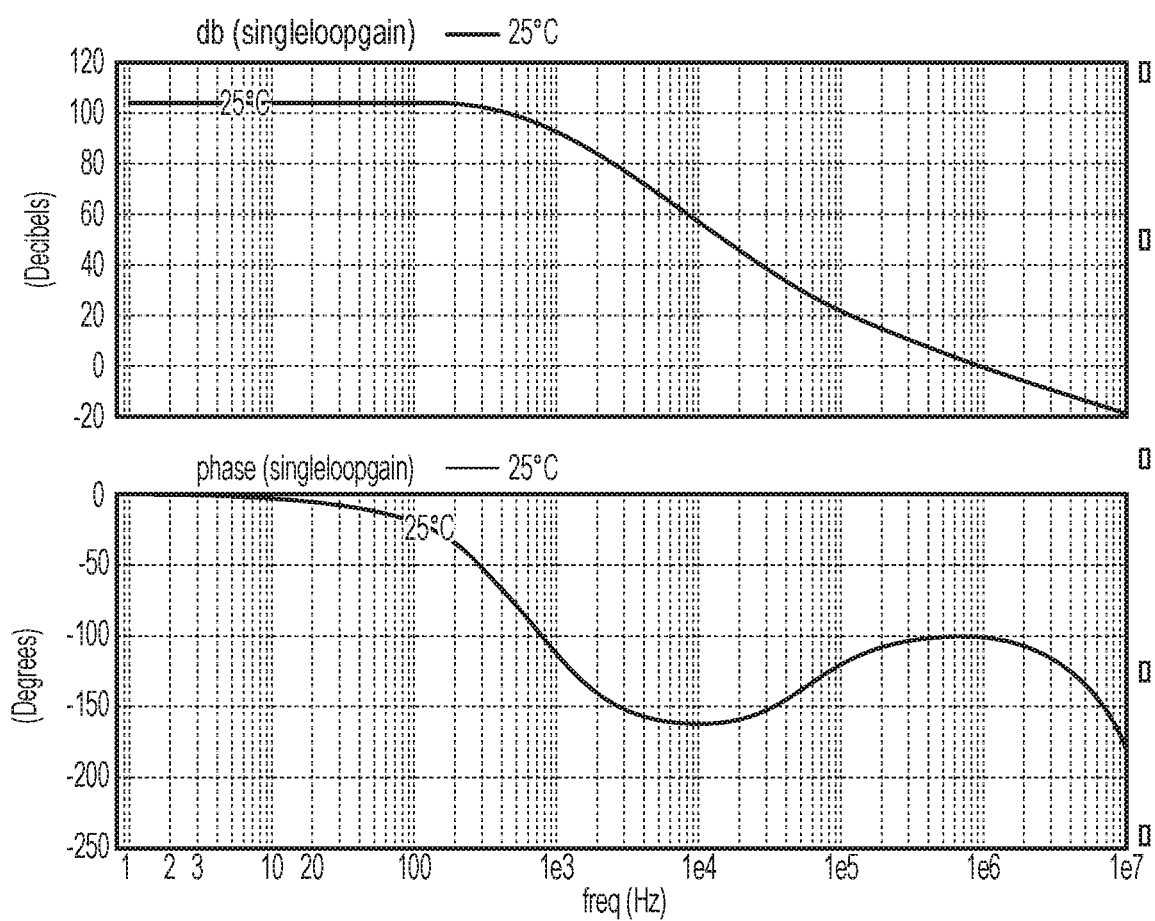
FIG. 7 shows a Bode plot of the frequency response of a two-pole opamp in a system of FIG. 1 at an operating temperature of 25° C.

FIG. 7 shows a Bode plot of the simulated frequency response of an opamp with a two-pole compensation network when implemented in the system of FIG. 1 or FIG. 2, at an operating temperature of 25° C. The opamp could be the differential opamp (105, 105b) or the voltage buffer (106) in the system of FIG. 1 or FIG. 2. The frequency response of the opamp with a two-pole compensation network shows several improvements when compared with the frequency response in FIG. 4 of a single-pole opamp at the same operating temperature.

As mentioned earlier, it is desirable to improve the gain of the amplifier in the mid-band frequency range. In the case of a single-pole opamp, in FIG. 4, the corner frequency is approximately 20 Hz. In the case of the two-pole opamp in FIG. 7, the corner frequency is extended to approximately 500 Hz. Together with this increase in bandwidth, there is also a significant increase in DC gain from 70 dB, in the case of the single-pole opamp (FIG. 4), to 104 dB in the case of the two-pole opamp (FIG. 7).

In FIG. 7, at approximately 100 kHz, the rate of change in the loop gain decreases from 40 dB/decade, for frequencies between 20 Hz to 100 kHz, to 20 dB/decade for frequencies above 100 kHz to $f_{co}$. This change in the slope of the loop gain is achieved by introducing a zero in the frequency response, using the two-pole compensation network, at approximately 100 kHz. Using this modification to the design of the opamp, the bandwidth at frequencies below the crossover frequency is improved thereby providing an improved usable bandwidth with improved gain in the mid-band frequencies, without requiring a significant increase in the crossover frequency.

With respect to the use of a Bode plot to depict the frequency response, stability is determined by phase margin and gain margin. The phase margin is measured at the crossover frequency (when loop gain is 1, that is, 0 dB) and is a measure of a difference between actual phase shift and the theoretical −180° required for oscillation or instability. The gain margin is measured at the phase crossover frequency which is the frequency when the phase of the loop gain is −180°. An amplifier with a feedback network is unstable or oscillates when the phase margin and gain margin are zero. This is another way of expressing the Barkhausen criterion for oscillation which requires the absolute magnitude of loop gain to be unity and the overall phase shift around the loop to be 0 or an integer multiple 2p. The overall phase shift comprises the phase shift of the amplifier (180° or p) and the phase shift of its feedback network (p).

Of the phase margin and gain margin, the phase margin is known to be critical for determining stability. If the phase of the loop gain at the crossover frequency is greater than −180°, the phase margin is positive and the system is stable. In the specific example of FIG. 7, the frequency response of the opamp is configured such that the phase margin at the cross-over frequency of 1 MHz is 77°. The introduction of the zero, at a frequency lower than the crossover frequency, using the two-pole compensation network, helps to cancel the second pole. Without the zero, the stability of the system would be compromised as the phase would reach 180° with any amount of parasitic contribution. Based on the above modification as a guide for design, it is possible to optimise the opamp to further improve the phase margin for improved stability.

Figure 8:
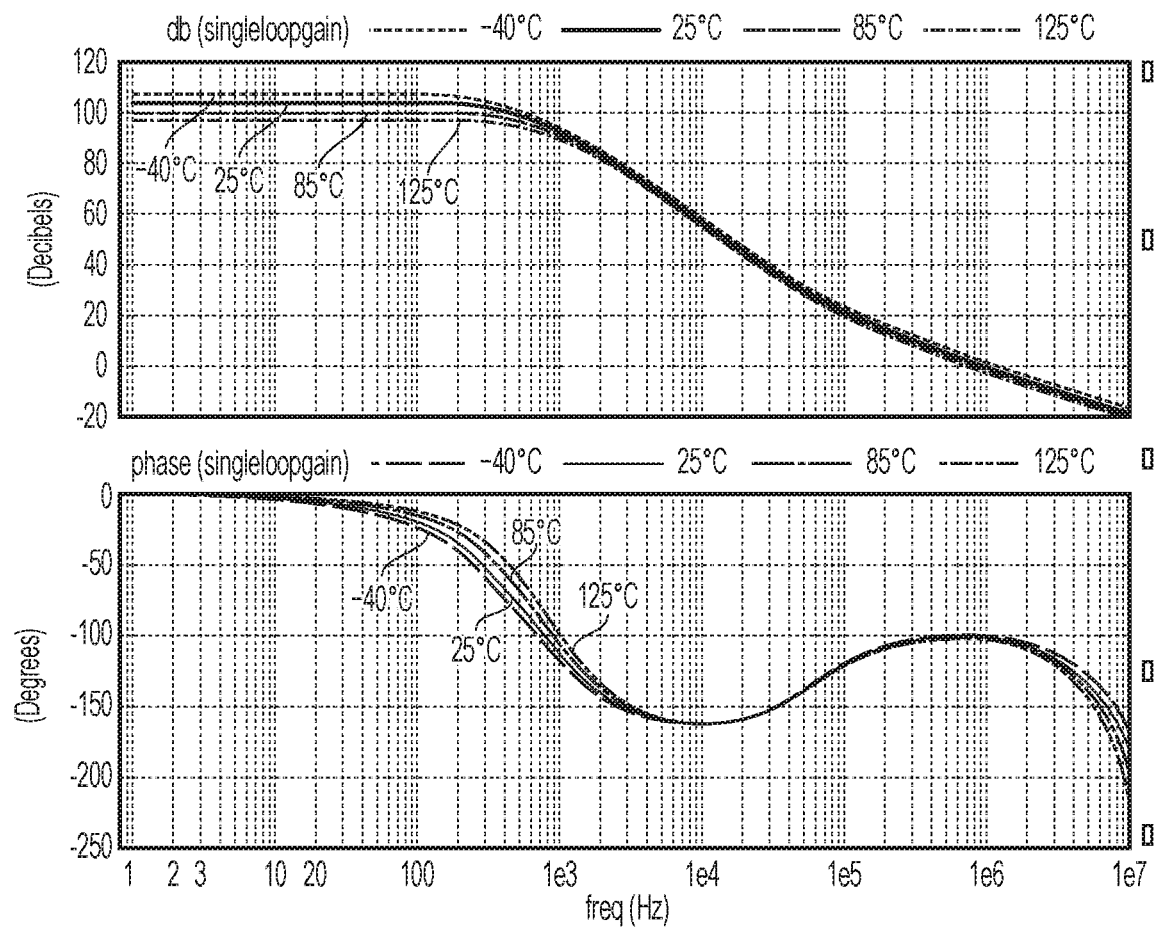
FIG. 8 shows a Bode plot of the frequency response of a two-pole opamp in a system of FIG. 1 at various operating temperatures.

The inventors have also found that a multi-pole opamp in a switch control system of FIG. 1 or FIG. 2, exhibits a frequency response with reduced dependence on operating conditions, in particular, the temperature of the system when compared to the frequency response of a single-pole opamp. FIG. 8 shows simulated frequency responses of a two-pole opamp for four different operating temperatures: −40° C., 25° C., 85° C. and 125° C. As seen in FIG. 8, the frequency response for the different operating temperatures is more uniform when compared with the frequency response in FIG. 4 of a single-pole opamp for the same operating temperatures.

Figure 9:
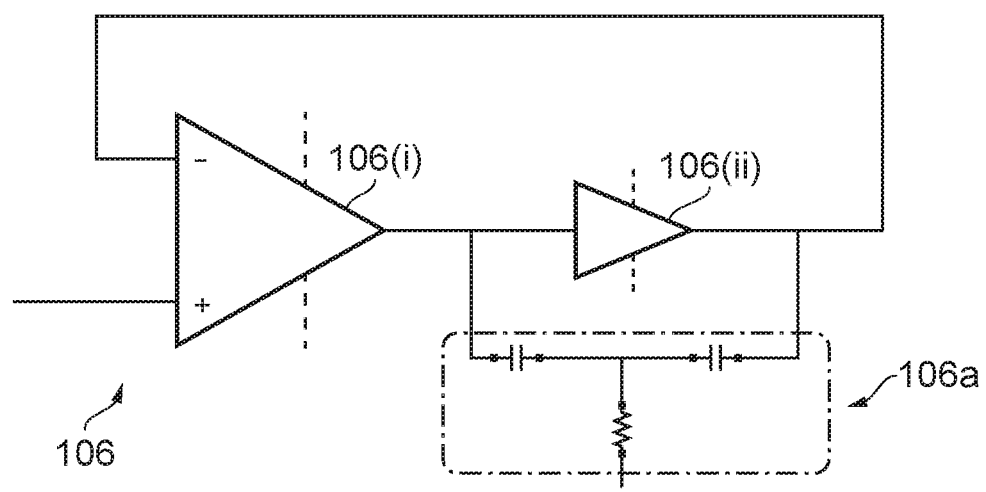
FIG. 9 shows an example circuit schematic of a two-stage opamp with a two-pole compensation network in the gain stage.

FIG. 9 shows an example of a two pole compensation network 106a in an opamp of the control unit 101 in order to achieve the frequency response as shown in FIG. 7 and FIG. 8. In FIG. 9, the opamp comprising the two-pole compensation network 106a is a voltage buffer 106. In the system 100 of FIG. 1 or FIG. 2, the voltage buffer 106 is configured to generate a low offset copy of a signal received from the switch 102. The voltage buffer 106 minimises disruption to the external circuit comprising the switch 102, when receiving feedback from the switch 102, during the operation of the control unit 101. While FIG. 9 shows the voltage buffer 106 comprising the two-pole compensation network 106a, in other embodiments, one or more of the opamps (105, 106) in the control unit 101 could be configured to have multi-pole, preferably two-pole, compensation network.

In FIG. 9, the voltage buffer 106 is shown as a two-stage opamp with a first differential input stage 106i and a second, inverting gain stage 106ii. In other embodiments, the opamp comprising the two-pole (or multi-pole) compensation network can be a single-stage opamp.

In one embodiment, the voltage buffer 106 can be a two-stage folded cascade opamp. A cascade arrangement, in general, allows for improved bandwidth, input-output isolation, and improved impedance (input and output) when compared to a single stage opamp. A folded cascode arrangement enables the performance of a cascode arrangement to be achieved at a lower supply voltage. For this reason, it is practically beneficial to configure the voltage buffer 106 as a two-stage folded cascode opamp.

As seen in FIG. 9, the two-pole compensation network 106a is in the local feedback loop of the second, inverting gain stage 106ii. The two-pole compensation network 106a comprises a T-bridge with a first capacitor C1, a second capacitor C2 and a resistor R1. The first capacitor C1 is connected in series with the second capacitor C2. A first end of the resistor R1 is connected to a node between the first capacitor C1 and the second capacitor C2 and a second end of the resistor R1 is connected to the source power voltage. The values of the resistor and capacitors can be selected to tailor the frequency response of the opamp 105 in order to achieve a desired bandwidth and loop gain, depending on the application requirements.

Figure 10:
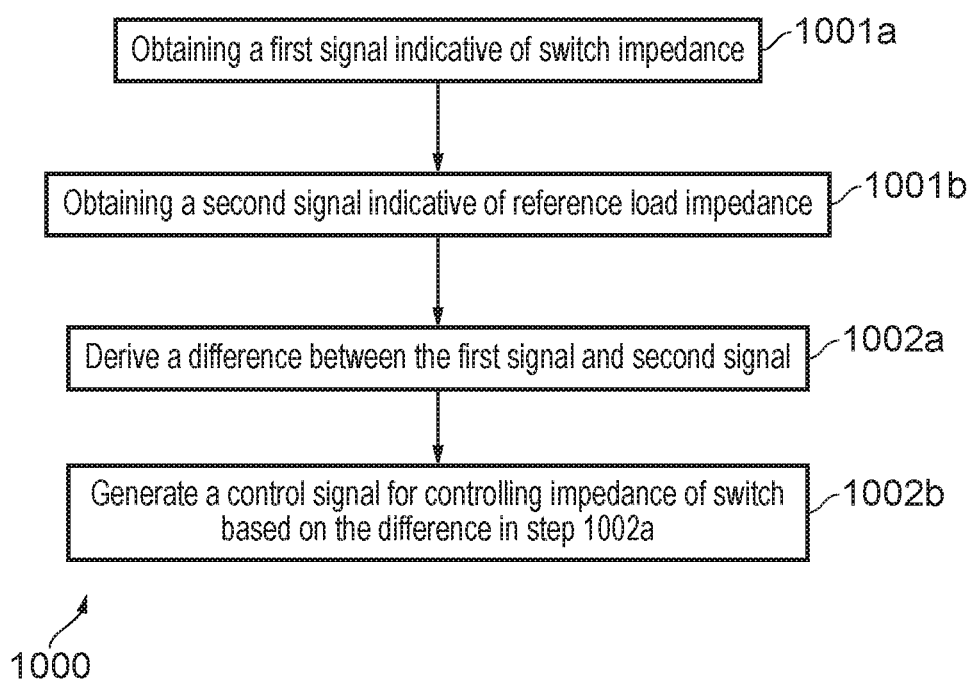
FIG. 10 shows a flow chart of a method for regulating an impedance of a switch using a switch control system of FIG. 1.

FIG. 10 shows a flow-chart for a method 1000 for controlling a switch 102 using a switch control system 100 according to the present invention. Step 1001a of the method 1000 comprises, obtaining, by a control unit 101, a first signal from the switch 102, the first signal being indicative of the impedance of the switch 102. Step 1001b of the method 1000 comprises obtaining a second signal from a reference load 103, the second signal being indicative of the impedance of the reference load 103. Step 1002 of the method 1000 comprises using a differential opamp to generate a control signal for controlling the impedance of the switch 102 (step 1002b) based on a difference between the first signal and the second signal (step 1002a). In this way, the impedance of the switch 102 is controlled such that it tracks the impedance of the reference load 103. As explained already with relation to the system 100 according to the present invention, at least one opamp of the control unit 101 (105, 106) is configured to have a plurality of dominant poles and at least one zero in its frequency response. Preferably, the differential opamp is configured to have at least two dominant poles and at least one zero in its frequency response.

EXAMPLES

Example 1 is a closed loop switch control system comprising: a switch; a control unit coupled to the switch, the control unit being configured to generate a control signal for regulating an impedance of the switch to a reference impedance, the control unit configured to have, in use, a frequency response comprising a plurality of dominant poles and at least one zero.

Example 2 is a system according to Example 1, wherein the control unit comprises: a first differential opamp; a replica switch configured to be substantially identical in use to the switch; and a reference unit, configured to have, in use, a reference impedance, wherein the replica switch and the reference unit are part of a feedback path of the closed loop switch control system, and wherein the first differential opamp is configured to generate said control signal based on a comparison between a first signal indicative of the impedance of the switch and a second signal indicative of the reference impedance.

Example 3 is a system according to Example 2, wherein the first differential opamp is configured to have, in use, said frequency response.

Example 4 is a system according to Example 3 wherein the number of dominant poles in said frequency response is one greater than the number of zeros in the frequency response.

Example 5 is a system according to Example 4, wherein the first differential opamp is configured to have two-poles and one zero in its frequency response.

Example 6 is a system according to Example 5, wherein the first differential opamp is configured to have a first differential input stage and a second gain stage and wherein the gain stage comprises a two-pole compensation network.

Example 7 is a system according to Example 6, wherein the two-pole compensation network comprises: a first capacitor serially coupled to a second capacitor; and a resistor coupled to a node in between the serially coupled capacitors.

Example 8 is a system according to Example 2, wherein the control unit further comprises a second opamp in said feedback path.

Example 9 is a system according to Example 8, wherein the second opamp is a voltage buffer configured to pass a signal from the switch to the switch replica with an offset.

Example 10 is a system according to Example 8 or Example 9, wherein at least one of the first differential opamp and the second opamp is configured to have, in use, said frequency response.

Example 11 is a system according to Example 10 wherein the number of dominant poles in said frequency response is one greater than the number of zeros in the frequency response.

Example 12 is a switch control system according to Example 10, wherein at least one of the first differential opamp and the second opamp has two stages, including a differential input stage and a gain stage.

Example 13 is a switch control system according to Example 11, wherein the gain stage comprises a two-pole compensation network.

Example 14 is a switch control system according to Example 12, wherein the two-pole compensation network comprises: a first capacitor serially coupled to a second capacitor; and a resistor coupled to a node in between the serially coupled capacitors.

Example 15 is a switch control system according to Example 1 wherein the switch is a field effect transistor and the control signal is the gate voltage of the field effect transistor.

Example 16 is a switch control system according to Example 1 wherein: the switch comprises a first field effect transistor serially coupled to a second field effect transistor, and the control signal is the common gate voltage of the first field effect transistor and the second field effect transistor.

Example 17 is a switch control system according to Example 1 wherein the switch replica comprises stacked field effect transistors and wherein the cumulative impedance of the stacked field effect transistors, in use, is configured to match the reference impedance.

Example 18 is a switch control system according to Example 2, wherein the reference unit is a precision resistor.

Example 19 is a control unit for regulating an impedance of a switch to a reference impedance, the control unit comprising: a first differential opamp; a replica switch configured to be substantially identical in use to the switch; and a reference unit, configured to have, in use, a reference impedance, wherein the first differential opamp is configured to generate a control signal for regulating the impedance of the switch based on a comparison between a first signal indicative of the impedance of the switch and a second signal indicative of the reference impedance, and wherein the control unit is configured to have a frequency response comprising a plurality of dominant poles and at least one zero.

Example 20 is a method for controlling an impedance of a switch, the method comprising:

obtaining, by a control unit, a first signal from the switch, the first signal being indicative of the impedance of the switch; obtaining, by the control unit, a second signal from a reference load, the second signal being indicative of the impedance of the reference load;

generating, using the control unit, a control signal for regulating the impedance of the switch to the impedance of the reference load based on a difference between the first signal and the second signal, wherein the control unit is configured to have, in use, a frequency response comprising a plurality of dominant poles and at least one zero.

Although this invention has been described in terms of certain embodiments, the embodiments can be combined to provide further embodiments. In addition, certain features shown in the context of one embodiment can be incorporated into other embodiments as well. In practical implementations, it is noted that the design verification process for the present invention will also account for layout dependent effects and parasitic impedance including interconnect. Furthermore, although the operation of the switch control circuit is described as a continuous time implementation, a discrete time implementation of the control circuit can also be used in accordance with the principles of the present disclosure.

The invention claimed is:

1. A closed loop switch control system comprising:
   a switch;
   a control unit coupled to the switch, the control unit being configured to generate a control signal for regulating an impedance of the switch to a reference impedance, the control unit configured to have, in use, a frequency response comprising a plurality of dominant poles and at least one zero.

2. A system according to claim 1, wherein the control unit comprises:
   a first differential opamp;
   a replica switch configured to be substantially identical in use to the switch; and
   a reference unit, configured to have, in use, a reference impedance, wherein the replica switch and the reference unit are part of a feedback path of the closed loop switch control system, and wherein the first differential opamp is configured to generate said control signal based on a comparison between a first signal indicative of the impedance of the switch and a second signal indicative of the reference impedance.

3. A system according to claim 2, wherein the first differential opamp is configured to have, in use, said frequency response.

4. A system according to claim 3 wherein the number of dominant poles in said frequency response is one greater than the number of zeros in the frequency response.

5. A system according to claim 4, wherein the first differential opamp is configured to have two-poles and one zero in its frequency response.

6. A system according to claim 5, wherein the first differential opamp is configured to have a first differential input stage and a second gain stage and wherein the gain stage comprises a two-pole compensation network.

7. A system according to claim 6, wherein the two-pole compensation network comprises:
a first capacitor serially coupled to a second capacitor; and
a resistor coupled to a node in between the serially coupled capacitors.

8. A system according to claim 2, wherein the control unit further comprises a second opamp in said feedback path.

9. A system according to claim 8, wherein the second opamp is a voltage buffer configured to pass a signal from the switch to the switch replica with an offset.

10. A system according to claim 8, wherein at least one of the first differential opamp and the second opamp is configured to have, in use, said frequency response.

11. A system according to claim 10 wherein the number of dominant poles in said frequency response is one greater than the number of zeros in the frequency response.

12. A system according to claim 10, wherein at least one of the first differential opamp and the second opamp has two stages, including a differential input stage and a gain stage.

13. A system according to claim 12, wherein the gain stage comprises a two-pole compensation network.

14. A system according to claim 13, wherein the two-pole compensation network comprises:
a first capacitor serially coupled to a second capacitor; and
a resistor coupled to a node in between the serially coupled capacitors.

15. A system according to claim 1 wherein the switch is a field effect transistor and the control signal is the gate voltage of the field effect transistor.

16. A system according to claim 1 wherein:
the switch comprises a first field effect transistor serially coupled to a second field effect transistor, and
the control signal is the common gate voltage of the first field effect transistor and the second field effect transistor.

17. A system according to claim 1 wherein the switch replica comprises stacked field effect transistors and wherein the cumulative impedance of the stacked field effect transistors, in use, is configured to match the reference impedance.

18. A system according to claim 2 wherein the reference unit is a precision resistor.

19. A control unit for regulating an impedance of a switch to a reference impedance, the control unit comprising:
a first differential opamp;
a replica switch configured to be substantially identical in use to the switch; and
a reference unit, configured to have, in use, a reference impedance,
wherein the first differential opamp is configured to generate a control signal for regulating the impedance of the switch based on a comparison between a first signal indicative of the impedance of the switch and a second signal indicative of the reference impedance, and
wherein the control unit is configured to have a frequency response comprising a plurality of dominant poles and at least one zero.

20. A method for controlling an impedance of a switch, the method comprising:
obtaining, by a control unit, a first signal from the switch, the first signal being indicative of the impedance of the switch;
obtaining, by the control unit, a second signal from a reference load, the second signal being indicative of the impedance of the reference load;
generating, using the control unit, a control signal for regulating the impedance of the switch to the impedance of the reference load based on a difference between the first signal and the second signal,
wherein the control unit is configured to have, in use, a frequency response comprising a plurality of dominant poles and at least one zero.

* * * * *